United States Patent [19]
Suh et al.

[11] Patent Number: 5,359,560
[45] Date of Patent: Oct. 25, 1994

[54] SEMICONDUCTOR MEMORY DEVICE HAVING IMPROVED REDUNDANCY EFFICIENCY

[75] Inventors: Dong-Il Suh, Kyungki; Tae-Sung Jang, Busan; Dae-Je Chin, Seoul, all of Rep. of Korea

[73] Assignee: Samsung Electronics Co., Ltd., Kyungki-do, Rep. of Korea

[21] Appl. No.: 162,467

[22] Filed: Dec. 7, 1993

[30] Foreign Application Priority Data

Dec. 7, 1992 [KR] Rep. of Korea ............... 23440/1992

[51] Int. Cl.⁵ ............................................. G11C 13/00
[52] U.S. Cl. .................................... 365/200; 365/210; 365/96
[58] Field of Search .......................... 365/200, 96, 210

[56] References Cited

U.S. PATENT DOCUMENTS 4,908,798  3/1990  Urai ..................................... 365/200

Primary Examiner—Terrell W. Fears
Attorney, Agent, or Firm—Stephen R. Whitt; Robert A. Westerlund; Charles R. Donohoe

[57] ABSTRACT

A row redundancy circuit for use in a semiconductor memory device. The row redundancy circuit providing fuse boxes to repair defective normal memory cells even in the adjacent normal memory cell arrays.

5 Claims, 7 Drawing Sheets

FUSE BOX
— REPAIRABLE —

FUSE BOX
— REPAIRABLE —

FUSE BOX
— REPAIRABLE —

SEMICONDUCTOR MEMORY DEVICE HAVING IMPROVED REDUNDANCY EFFICIENCY

BACKGROUND OF THE INVENTION

The present invention relates to semiconductor memory devices, and more particularly to semiconductor memory devices having a row redundancy circuit for replacing (or substituting) defective normal memory cell(s) in a row with a spare or redundant memory cell to repair the defective memory cells.

As is well known in this technical field, semiconductor memory devices have a plurality of memory cells arranged in rows and columns, i.e., in the form of a matrix. In general, as the semiconductor memory devices have been constructed with arrays having increasingly higher densities, the unit area alloted to individual memory cells has decreased. If a defect is present in even one of the memory cells, the semiconductor memory device cannot be used. Thus, to improve the yield of the semiconductor memory devices, a redundancy technique is commonly employed, whereby defective memory cells are replaced with the reductant memory cells which are provided in the respective rows and columns during fabrication of the semiconductor device. In an early redundancy technique, fuses are connected to each bit line or word line. When a memory cell is found to be defective, the corresponding fuse connected between the bit line or word line and the defective memory cell is opened to thereby cut off the defective memory cell and allow the cell redundancy to be used to replace the defective memory cell.

Unfortunately, as memory cell density for semiconductor memory devices has increased, it has become increasingly inefficient and troublesome to provide fuses for all of the memory cells. Thus, a method of decoding internal address signals for the individual redundant memory cell has been used, particularly where a defective memory cell occurs in semiconductor devices providing row redundancy circuits.

FIG. 1 is a schematic block diagram for a conventional semiconductor device having row redundancy circuits and using an internal address decoding method. In FIG. 1, a normal memory cell array 20L and redundant memory cell array 30L are arranged on the left side. A normal memory cell array 20R and redundant memory cell array 30R are arranged on the right side. Each side is centered on an input/output line 50. Further, the normal memory cell arrays 20L and 20R, and the redundant memory cell arrays 30L and 30R are connected to sense amplifier sections 40L and 40R, respectively. Sense amplifier control circuits 60L and 60R, redundant word line drivers 70L and 70R and fuse boxes 80L and 80R are further provided. Here, each of the sense amplifier sections 40L and 40R includes a bit line equalizing circuit, a sense amplifier composed of a P-type sense amplifier and an N-type sense amplifier, an isolation gate, etc. FIG. 1 shows only two memory arrays taken from the memory device, ad the number of the memory arrays is expandable.

In operation, the redundant memory cell arrays 30L and 30R are selected in response to redundant address signals REDL and REDR supplied from the fuse boxes 80L and 80R, and are enabled in response to the output signals RWLL and RWLR of the redundant word line drivers 70L and 70R, respectively. In other words, if the left normal memory cell array 20L is defective, the left redundant memory cell array 30L is used to repair the defect, and if the right normal memory cell array 20R is defective, the right redundant memory cell array 30R is used to repair the defect. For instance, if an arbitrary memory cell in the left normal memory cell array 20L is defective, a redundant word line corresponding to the defective normal word line is enabled in the redundant memory cell array 30L, and an output of the normal word line driver 90L is disabled in response to the redundant address signal REDL.

Turning now to FIG. 2, the fuse box 80L for programming the defect-generated address for the redundancy is illustrated. Transistors m1 to mi receive row address signals and are used to select a memory cell within the memory array by selectively connecting fuses f1 to fi. Transistors A0 and A1 receive block selection address signals and are used to select the memory arrays do not have fuses connected thereto. In the redundancy programming, if the block selection address signals A0 and A1 are held to the "low" level, and the row address signals related to the defective memory cell are entered, the fuses receiving the defective address signals are properly opened (cut off) by, for example, laser beam projection, thereby allowing node n1 to have a "high" level and thus, connecting redundant word line RWL with a signal $\Phi X$ to enable the redundant word line RWL.

However, in FIG. 2, since the block selection address signals A0 and A1 applied to the fuse box are limited to two, the repair operation is restrictive. This limitation is also shown in FIGS. 3A and 3B, in which the dotted line represents the defective normal word line and the solid line the redundant word line. Accordingly, if the number of defective word lines in a memory cell array is larger than the number of redundant word lines provided in the memory cell array, not all of the defective word lines can be repaired. See FIG. 3B. It also means that a redundant word line belonging to a specific memory cell array cannot replace the defective word line belonging to adjacent memory cell arrays. This is because the adjacent memory cell arrays have a fuse box as shown in FIG. 2, and also because block selection address signals A0 and A1 applied to the fuse box are limited in number. Accordingly, at least one extra fuse box should be provided to increase the yield of memory cells. However, this provision has heretofore placed a heavy burden on attempts to increase memory cell density in semiconductor memory devices. This becomes an even more severe problem since the number of fuse boxes gradually increases as the semiconductor memory device is integrated to larger and larger degrees.

SUMMARY OF THE INVENTION

It is therefore an object of the present invention to provide a row redundancy circuit, wherein adjacent memory cell arrays share a fuse box, so as to repair defective memory cells even in the adjacent memory cell arrays.

According to an aspect of the present invention, a row redundancy circuit includes a first memory cell array having a first redundant memory cell array for replacing a defective memory cell, a second memory cell array being adjacent to the first memory cell array and having a second redundant memory cell array for replacing a defective memory cell, first and second sense amplifiers formed between the first and second memory cell arrays for sensing data from the first and second memory cell arrays, first and second fuse boxes each receiving block selection address signal for selecting the redundant memory cell arrays and row address signals for selecting redundant word lines in the selected redundant memory cell arrays, the fuse boxes including fuses on a path of receiving the block selection address signals, and first and second redundant word line drivers receiving the output of the fuse boxes, for supplying redundant word line driving signals to the first and second redundant memory cell arrays respectively, so that each of the redundant word line drivers can repair the defective memory cells both in first and second memory cell arrays.

Further, the fuse boxes each includes, first and second MOS transistors each receiving first and second block selection address signals, first and second fuses respectively connected between the output of the fuse boxes and the first and second MOS transistors, and a third MOS transistor receiving a third block selection address signal, connected between the output of the fuse boxes and a ground reference voltage.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE PREFERRED EMBODIMENTS

Figure 4:
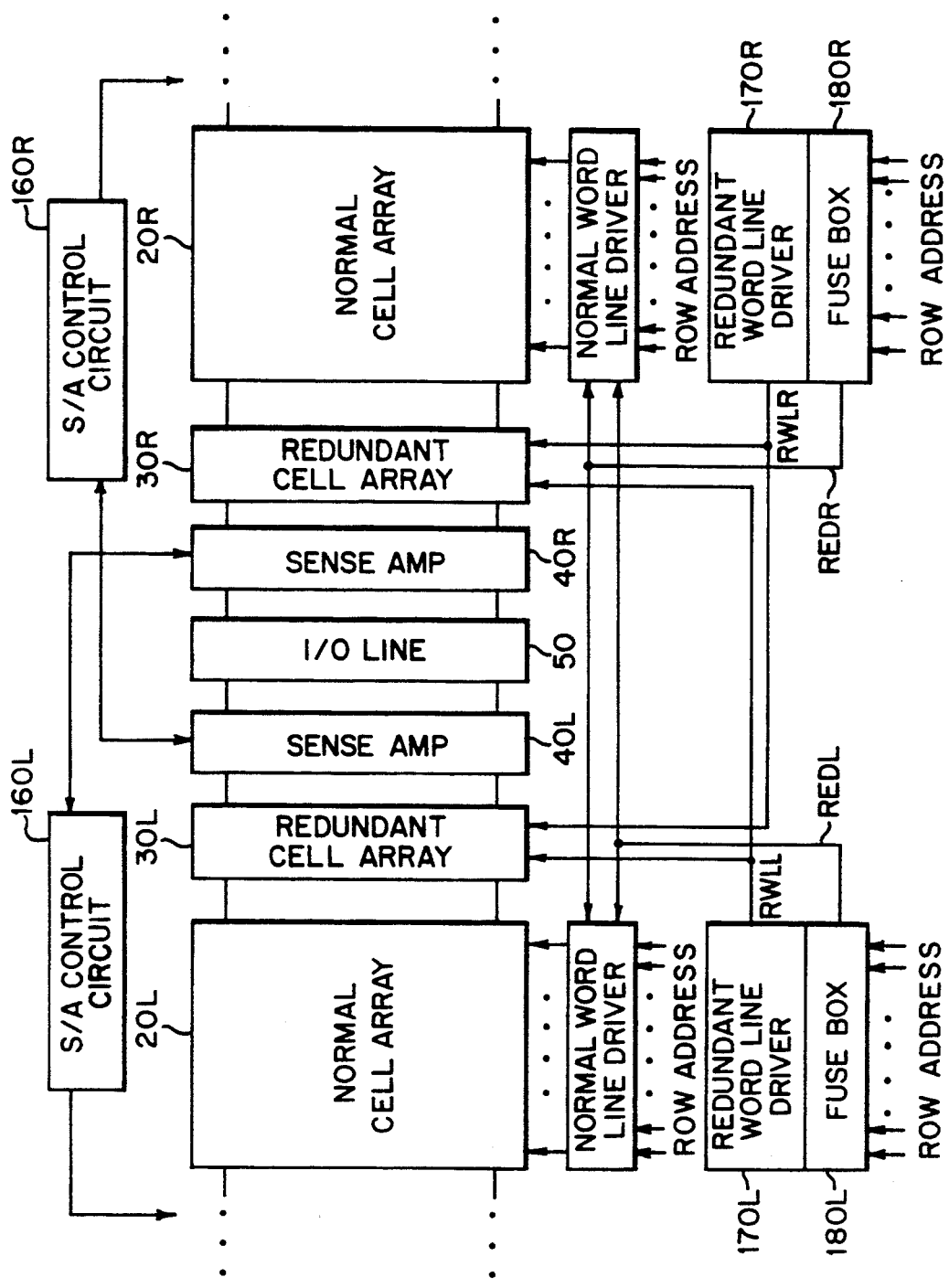
FIG. 4 is a block diagram of a row redundancy circuit according to the present invention.

Turning now to FIG. 4, a row redundancy circuit according to the present invention has a left sense amplifier control circuit 160L connected to a right sense amplifier section 40R, a right sense amplifier control circuit 160L connected to a right sense amplifier section 40R, a right sense amplifier control circuit 160R connected to a left sense amplifier section 40L, a left fuse box 180L receiving row address and block selection address signals for selecting memory cells in left and right memory cell arrays 20L and 20R, a right fuse box 180R receiving the row address and block selection address signals for selecting memory cells in right and left memory cell arrays 20R and 20L, a left redundant word line driver 170L connected to the left fuse box 180L for enabling both of a left redundant memory cell array 30L and a right redundant memory cell array 30R, and a right redundant word line driver 170R connected to the right fuse box 180R for enabling both of the left redundant memory cell array 30L and the right redundant memory cell array 30R. In more detail, it should be noted that the left and right redundant memory cell arrays 30L and 30R each are divided again into first and second redundant memory cell array blocks. The first redundant memory cell array blocks of the respective left and right redundant memory cell arrays 30L and 30R are commonly connected to the left word line driving signal RWLL from the left redundant word line driver 170L. In similar, the second redundant memory cell array blocks of the respective left and right redundant memory cell arrays 30L and 30R are commonly connected to the right word line driving signal RWLR from the right redundant word line driver 170R. Thus, by using the two fuse boxes 180L and 180R, the four redundant word lines in the left and right redundant memory cell arrays 30L and 30R can be controlled to repair the defective normal word lines, since the redundant word lines share the fuse boxes.

Figure 1:
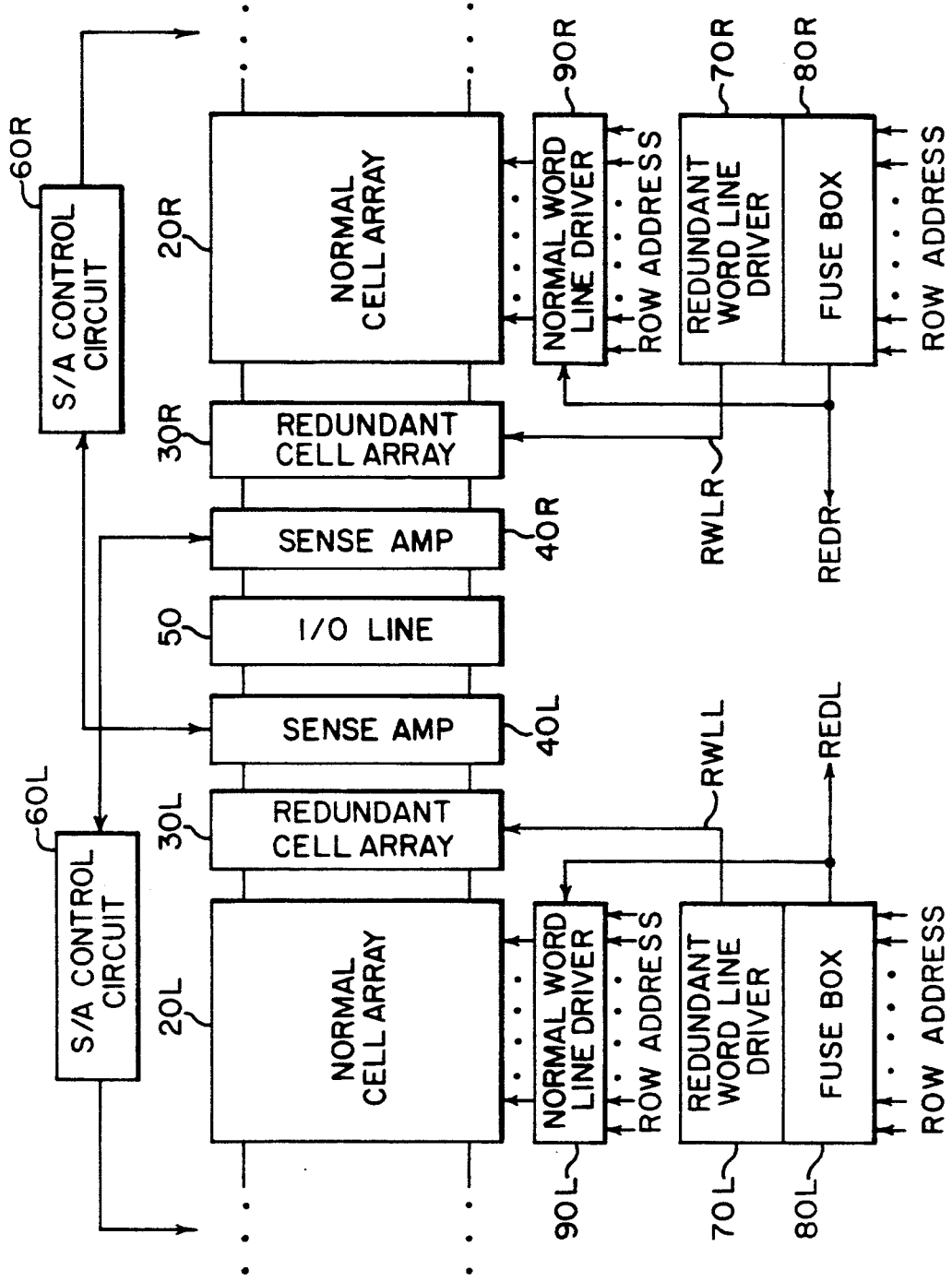
FIG. 1 is a block diagram of a conventional row redundancy circuit according to the prior art.
Figure 6A:
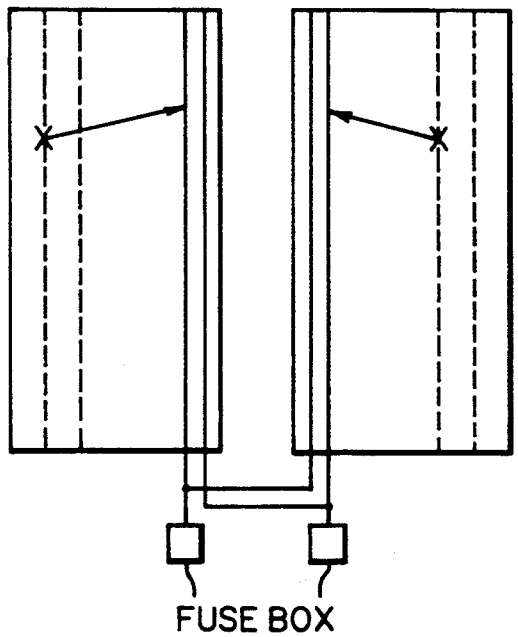
FIGS. 6A through 6C are block diagrams showing various repair operations by using the fuse box of FIG. 4.
Figure 6B:
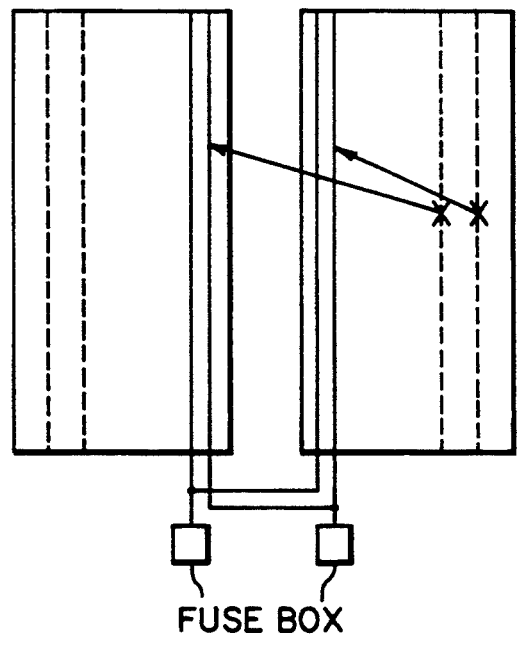
Figure 6C:
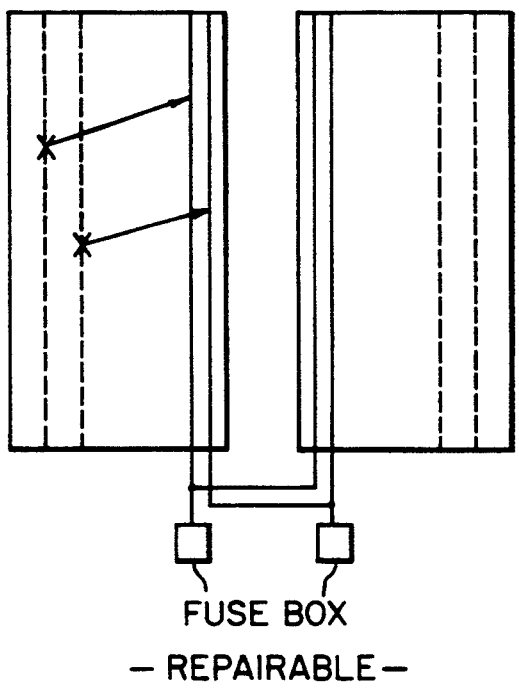

For instance, when the left and right memory cell arrays 20L and 20R each have one defective word line as shown in FIG. 6A which is small in number than the number of redundant word lines in the left and right redundant memory cell arrays 30L and 30R, the row redundancy circuit performs the same repair operation as that of the conventional row redundancy circuit of FIG. 1. However, for instance, if the right memory cell array 20R has not defective word lines and the left memory cell array 20L has two defective word lines as shown in FIG. 6C, then the row redundancy circuit is programmed such that the right fuse box 180R as well as the left fuse box 180L performs the redundancy operation for the defective left memory cell array 20L are both repaired by using the left and right fuse boxes 180L and 180R. Accordingly, the two defective word lines in the left memory cell array 20L. Meanwhile, when the left memory cell array 20L has no defective word line and the right memory cell array 20R has defective word lines as shown in FIG. 6B, then the two defective word lines in the right memory cell array 20R are both repaired by using the left and right fuse boxes 180L and 180R. The row redundancy circuit according to the present invention has the same effect as a single memory cell array has two redundant word line drivers and two fuse boxes. Accordingly, the redundancy efficiency increases substantially two times higher than that of the conventional device in FIG. 1.

Figure 5A:
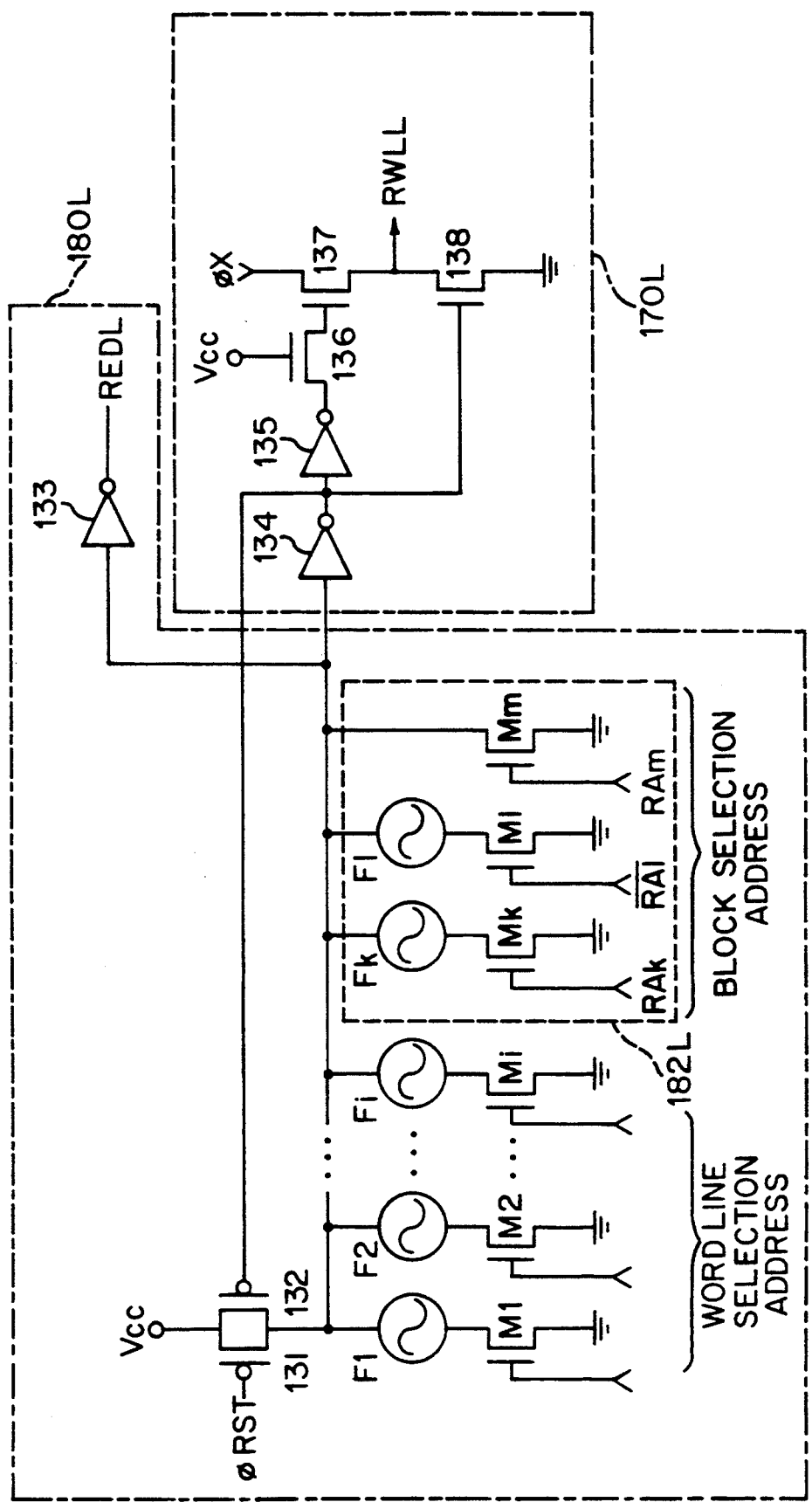
FIGS. 5A and 5B are detailed circuit diagrams of fuse boxes and redundancy word line drivers shown in FIG. 4.
Figure 5B:
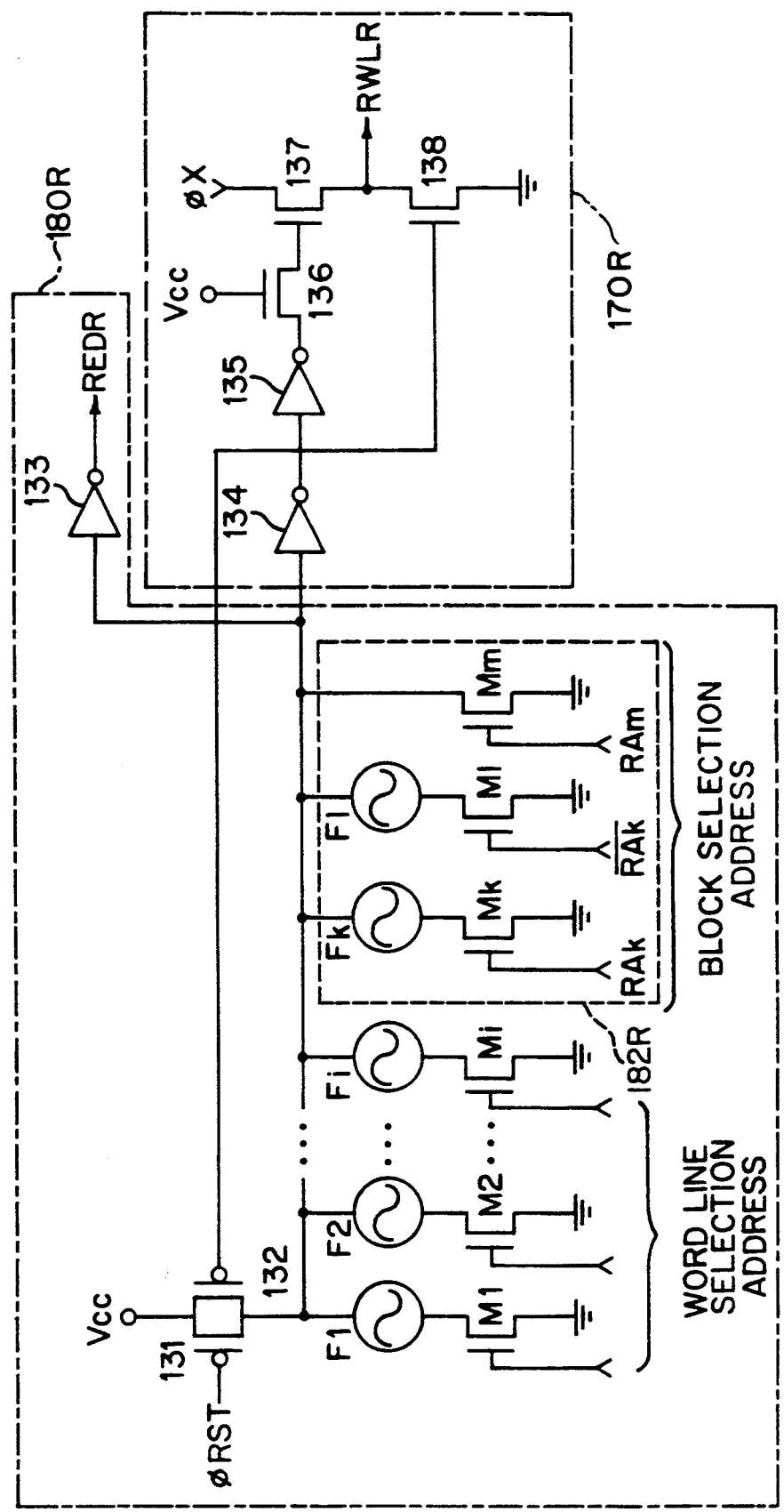

The redundant word line drivers 170L, 170R and the fuse boxes 180L, 180R according to the present invention can be implemented as shown in FIGS. 5A and 5B, respectively. The fuse boxes 180L and 180R are provided with block selection address signal RAk, Rak and Ram, and fuses Fk and Fl connected to MOS transistors Mk and Ml each receiving the block selection address signals Rak and Rak according to an embodiment of the present invention, as well shown in the dotted blocks 182L and 182R which represent the features of the present invention. Further, row address signals are entered to transistors Ml to Mi, to select redundant word lines RWLL and RWLR in the redundant memory cell arrays 30L and 30R. The dotted blocks 182L and 182R are so designed as to allow the redundant word line drivers 170L and 170R to freely enable the redundant word lines contained in either the left redundant memory cell array 30L or the right redundant memory cell array 30R according to the connection/disconnection of the fuses Fk and Fl. Accordingly, the left fuse box 180L and the left redundant word line driver 170L shown in FIG. 5A can repair the defective word lines in the right normal memory cell array 20R as well as in the left normal memory cell array 20L. In similar, the right fuse box 180R ad the right redundant word line driver 170R shown in FIG. 5B can repair the defective word lines in the left normal memory cell array 20L as well as in the right normal memory cell array 20R. NMOS transistors 137 and 138 constituted an output circuit of the redundant word line drivers 170L and 170R, which respectively enable redundant word lines RWLL and RWLR during the redundancy operation.

Operations of the row redundancy circuit of FIG. 4 will now be described in detail in conjunction with FIGS. 5A and 5B.

Figure 2:
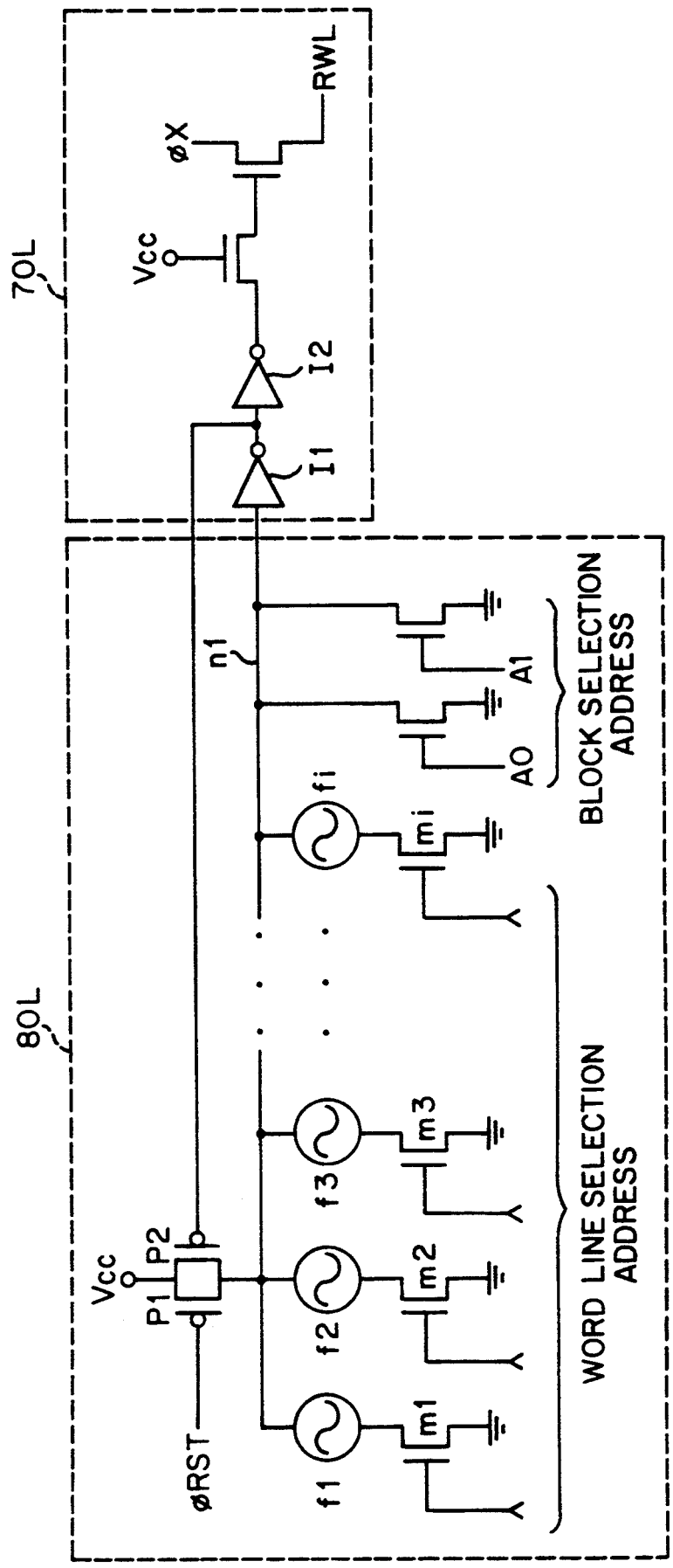
FIG. 2 is a detailed circuit diagram of a fuse box shown in FIG. 1.
Figure 3B:
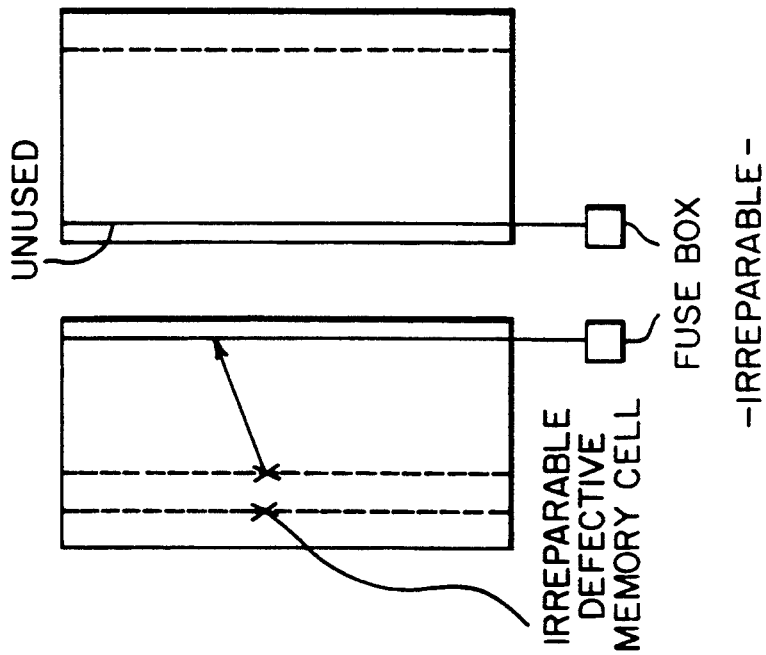
FIGS. 3A and 3B are block diagrams showing various repair operations by using the fuse box of FIG. 2.
Figure 3A:
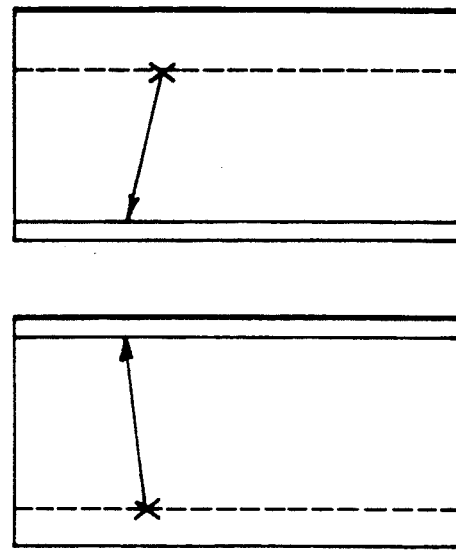

As explained before, since the conventional fuse box 80L shown in FIG. 2 has no fuses connected to the MOS transistor receiving the block selection address signals A0 and A1, the fuse box 80L and the redundant word line driver 70L belonging to the memory cell array 20L couldn't repair the defective word lines in the adjacent memory cell array 20R. However, the fuse boxes 180L and 180R according to the present invention have fuses Fk and F1 connected to the MOS transistors Mk and M1 receiving the block selection address signals Rak and Rak, so that they can repair the defective word lines even in adjacent memory cell arrays.

For the sake of explanation, it will be assumed that the left memory cell array 20L has no defective normal word lines, the right memory cell array 20R has two defective word lines, and the redundant memory cell arrays 30L and 30R each include first and second redundant word lines in which the first redundant word lines are commonly connection to the left redundant word line driving signal RWLL of the left redundant word line driver 170L, and the second redundant word lines are commonly connection to the right redundant word line driving signal RWRL of the right redundant word line driver 170R. If the dotted block 182L of FIG. 5A receives the block selection address signals RAK and Rak for selecting the right memory cell array 20R by programming the fuses Fk and F1, and the row address signals for addressing the defective normal memory cell are applied to the MOS transistors M1 to Mi, then the row redundancy circuit of FIG. 4 can repair the two defective word lines in the right normal memory cell array 20R, in cooperation with the right fuse box 180R and the right redundant word line driver 170R of FIG. 5B (see FIG. 6B). At this time, since the left and right sense amplifier sections 40L and 40R are enabled depending only on the block selection address signals of the corresponding memory cell arrays regardless of which redundant word line drivers are currently selected, data from the left redundant memory cell array 30L can be sensed through the left sense amplifier section 40L. As can be clearly understood from FIGS. 6A to 6C, the redundancy efficiency is maximized since the 50 fuse boxes and redundant word line drivers of the row redundancy circuit according to the present invention have the same effect as a single memory cell array has two fuse boxes and two redundant word line drivers, as described above. Accordingly, in case that the number of defective word lines in a specific memory cell array is larger than the number of the fuse boxes provided to the specific normal memory cell array, the present invention does not need to have extra fuse boxes, unlike the convention device. Instead, the fuse box provided to the adjacent memory cell array is used to repair the defective word line. Accordingly, deterioration of the chip density due to an increase of the fuse boxes in number is prevented.

FIGS. 5A and 5B show only a preferred embodiment optimally implementing the idea of the present invention, and the constitutions can be variously modified without departing from the technical scope of the present invention. It should be understood that the number of block selection address signals and the fuses used can be properly adjusted in consideration of the number of memory cells existing in the normal and redundant memory cell arrays.

As described above, in the row redundancy circuit according to the present invention, the fuse boxes and the reductant word line drivers can repair the defects in adjacent memory arrays, so that there is no need to increase fuse boxes to make the redundancy efficiency higher. Accordingly, the deterioration of the chip density is prevented and the redundancy efficiency is increased substantially two times higher than that of the conventional apparatus.

What is claimed is:

1. A row redundancy circuit in a semiconductor memory device including a first memory cell array having a first redundant memory cell array for replacing a defective memory cell, a second memory cell array, adjacent to said first memory cell array, having a second redundant memory cell array for replacing a defective memory cell, and sense amplifier between said first and second memory cell arrays for sensing data from said first and second memory cell arrays, the row redundancy circuit comprising:
   fuse box means, receiving block selection address signals, for selecting the redundant memory cell arrays, receiving row address signals, for selecting redundant word lines in the selected redundant memory cell array, and, for producing an output, said fuse box means comprising at least one fuse on a signal path used to receive said block selection address signals; and
   redundant word line driver means, receiving the output of said fuse box means, for supplying redundant word line driving signals to said first and second redundant memory cell arrays respectively.

2. A row redundancy circuit as claimed in claim 1, wherein said redundant word line driver means can repair the defective memory cells both in the first and second memory cell arrays.

3. A row redundancy circuit as claimed in claim 1, wherein said fuse box means comprises:
   means for receiving the row address signal for selecting redundant word lines in the selected redundant memory cell array;
   first and second MOS transistors each receiving first and second block selection address signals;
   first and second fuses respectively connected between the output of said fuse box means and said first and second MOS transistors; and
   a third MOS transistor receiving a third block selection address signal, connected between the output of said fuse box means and a ground reference voltage.

4. A row redundancy circuit used for a semiconductor memory device including first and second memory cell arrays being adjacent to each other, and first and second sense amplifiers respectively connected to said first and second memory cell arrays for sensing data from said first and second memory cell arrays, comprising:
   first and second redundant memory cell arrays respectively subjected to said first and second memory cell arrays, said first and second redundant memory cell arrays each being divided again into first and second redundant memory cell array blocks;

a first fuse box receiving block selection address signals for selecting the redundant memory cell arrays and row address signals for selecting redundant word lines in the selected redundant memory cell array, said first fuse box comprising fuses on a path of receiving said block selection address signals;

a first redundant word line driver receiving the output of said first fuse box, for supplying a redundant word line driving signal to said first redundant memory cell array blocks of the respective first and second redundant memory cell arrays;

a second fuse box receiving the block selection address signals for selecting the redundant memory cell arrays and the row address signals for selecting redundant word lines in the selected redundant memory cell array, said second fuse box comprising fuses on a path of receiving said block selection address signals; and a second redundant word line driver receiving the output of said second fuse box, for supplying a redundant word line driving signal to said second redundant memory cell array blocks of the respective first and second redundant memory cell arrays;

whereby said first and second redundant word line drivers each can repair the defective memory cells both in the first and second memory cell arrays, respectively.

5. A row redundancy circuit as claimed in claim 4, wherein said first and second fuse boxes each comprise:

means for receiving the row address signal for selecting redundant word lines in the selected redundant memory cell array;

first and second MOS transistors each receiving first and second block selection address signals;

first and second fuses respectively connected between the output of the respective first and second fuse boxes and said first and second MOS transistors; and a third MOS transistor receiving a third block selection address signal, connected between the output of the respective first and second fuse boxes and a ground reference voltage.

* * * * *